(12) United States Patent
Choi et al.

(10) Patent No.: US 9,693,487 B2
(45) Date of Patent: Jun. 27, 2017

(54) HEAT MANAGEMENT AND REMOVAL ASSEMBLIES FOR SEMICONDUCTOR DEVICES

(71) Applicant: Caterpillar Inc., Peoria, IL (US)

(72) Inventors: Edward Choi, Edwards, IL (US);
Chris J. Scolton, Edelstein, IL (US);
Jacob Wyss, Eureka, IL (US)

(73) Assignee: Caterpillar Inc., Peoria, IL (US)

( * ) Notice: Subject to any disclaimer, the term of this patent is extended or adjusted under 35 U.S.C. 154(b) by 42 days.

(21) Appl. No.: 14/616,083

(22) Filed: Feb. 6, 2015

(65) Prior Publication Data

US 2016/0234967 A1 Aug. 11, 2016

(51) Int. Cl.
*H05K 7/20* (2006.01)
*H01L 23/473* (2006.01)

(52) U.S. Cl.
CPC ..... *H05K 7/20927* (2013.01); *H05K 7/20918* (2013.01); *H01L 23/473* (2013.01); *H05K 7/20254* (2013.01)

(58) Field of Classification Search
CPC .......... H05K 7/20218; H05K 7/20254; H05K 7/20245; H05K 7/20272; H05K 7/20627; H05K 7/20872; H05K 7/20981; H05K 7/20763; H01L 23/46; H01L 23/473
USPC .............. 361/699, 701–702; 165/80.4–80.5, 165/104.33; 257/714
See application file for complete search history.

(56) References Cited

U.S. PATENT DOCUMENTS

| | | | |
|---|---|---|---|
| 7,200,007 B2 | 4/2007 | Yasui et al. | |
| 7,353,859 B2 | 4/2008 | Stevanovic et al. | |
| 7,571,759 B2 | 8/2009 | Inagaki et al. | |
| 7,884,468 B2 | 2/2011 | Mann et al. | |
| 8,033,326 B2 * | 10/2011 | Dakhoul | F28F 3/086 165/167 |
| 8,397,796 B2 | 3/2013 | Thayer et al. | |
| 8,441,827 B2 | 5/2013 | Baker et al. | |
| 8,464,781 B2 | 6/2013 | Kenny et al. | |
| 8,564,953 B2 | 10/2013 | Horiuchi et al. | |
| 8,726,976 B2 | 5/2014 | Schrader et al. | |
| 8,835,038 B2 * | 9/2014 | Abels | H01M 2/1077 429/120 |
| 2003/0094265 A1 | 5/2003 | Chu et al. | |
| 2005/0180104 A1 * | 8/2005 | Olesen | F28F 3/12 361/699 |

(Continued)

FOREIGN PATENT DOCUMENTS

CN 202772128 U 3/2013
CN 103697743 A 4/2014
(Continued)

*Primary Examiner* — Zachary M Pape
*Assistant Examiner* — Amir Jalali
(74) *Attorney, Agent, or Firm* — Miller, Matthias & Hull Hibshman Claim Construction PLLC

(57) ABSTRACT

This patent disclosure describes heat management and removal assemblies for electronic devices that generate heat during use. The disclosed assemblies are particularly useful for cooling insulated gate bipolar transistors (IGBTs). The disclosed assemblies provide a low-resistance parallel cooling circuit for efficiently delivering coolant to one or more electronic devices. The disclosed parallel cooling circuits and assembly designs reduce the pump power required to deliver coolant to one or more electronic devices.

20 Claims, 8 Drawing Sheets

(56) References Cited

U.S. PATENT DOCUMENTS

| | | | |
|---|---|---|---|
| 2006/0096738 A1* | 5/2006 | Kang | F28F 3/022 165/80.4 |
| 2006/0113661 A1* | 6/2006 | Yamabuchi | G05D 23/192 257/706 |
| 2006/0124289 A1 | 6/2006 | Shinmura et al. | |
| 2006/0219388 A1* | 10/2006 | Terakado | G06F 1/203 165/80.4 |
| 2006/0291165 A1* | 12/2006 | Flesch | H01L 23/473 361/699 |
| 2007/0012423 A1 | 1/2007 | Kinoshita et al. | |
| 2007/0227697 A1* | 10/2007 | Takahashi | H01L 23/473 165/80.4 |
| 2008/0128067 A1 | 6/2008 | Sayir et al. | |
| 2008/0230396 A1 | 9/2008 | Lee et al. | |
| 2009/0145581 A1* | 6/2009 | Hoffman | F28F 1/40 165/80.3 |
| 2009/0260775 A1 | 10/2009 | Maucher et al. | |
| 2010/0032147 A1* | 2/2010 | Valenzuela | F28F 3/12 165/163 |
| 2010/0252242 A1* | 10/2010 | Xiangxun | F28D 1/05391 165/173 |
| 2010/0294461 A1 | 11/2010 | Weaver et al. | |
| 2010/0321889 A1* | 12/2010 | Yoshino | H05K 7/20927 361/702 |
| 2010/0326750 A1* | 12/2010 | Murakami | B60L 11/1887 180/65.31 |
| 2011/0132016 A1 | 6/2011 | Chandler et al. | |
| 2011/0226448 A1* | 9/2011 | Valenzuela | F28F 3/12 165/109.1 |
| 2012/0193077 A1* | 8/2012 | Choi | F28F 13/12 165/109.1 |
| 2013/0050944 A1 | 2/2013 | Shepard | |
| 2013/0112369 A1* | 5/2013 | Matsushima | H01L 23/473 165/67 |
| 2013/0146254 A1 | 6/2013 | Jeon et al. | |
| 2013/0168071 A1 | 7/2013 | Hugelier et al. | |
| 2013/0284404 A1 | 10/2013 | Matsuchima et al. | |
| 2014/0077591 A1 | 3/2014 | Saitou et al. | |
| 2014/0118932 A1* | 5/2014 | Harmelink | H05K 7/20254 361/689 |
| 2014/0145107 A1 | 5/2014 | Bromberg et al. | |
| 2014/0291832 A1 | 10/2014 | Schwarz | |
| 2014/0319674 A1 | 10/2014 | Miyazawa | |
| 2014/0327128 A1 | 11/2014 | Yoo et al. | |
| 2016/0025422 A1* | 1/2016 | Strange | B23P 15/26 165/168 |
| 2016/0120063 A1* | 4/2016 | Cheng | H05K 7/20272 165/80.4 |

FOREIGN PATENT DOCUMENTS

| | | |
|---|---|---|
| EP | 2738800 A2 | 6/2014 |
| JP | 2011069552 A | 4/2011 |
| JP | 2013225553 A | 10/2013 |
| WO | 2011120752 A1 | 10/2011 |
| WO | 2013122594 A1 | 8/2013 |

* cited by examiner

HEAT MANAGEMENT AND REMOVAL ASSEMBLIES FOR SEMICONDUCTOR DEVICES

BACKGROUND

Technical Field

This disclosure relates to heat management and removal assemblies for semiconductor devices. More specifically, this disclosure relates to an assembly that may provide parallel flow of coolant to multiple semiconductor devices.

Description of the Related Art

Power semiconductor devices, such as insulated gate bipolar transistors (IGBTs), are utilized in a wide scope of applications. In many of these applications, the power semiconductor device generates heat, and it may be necessary to remove heat from the device before the heat adversely affects the performance of the device or surrounding components.

Various systems and devices may be utilized to remove heat from power semiconductor device and other heat generating electronic devices, including direct liquid cooling systems. Direct liquid cooling systems may utilize a coolant flow system which may be configured to remove heat from such heat generating electronic devices by circulating a liquid coolant in thermal proximity with a heated surface, or substrate, of an electronic device or devices such that the coolant absorbs, and thereby removes heat from the device. However, typical direct liquid cooling systems may present inefficiencies as well as other drawbacks such as, for example, coolant leakage, insufficient or inconsistent coolant flow through the cooling system, insufficient or inconsistent coolant flow in thermal proximity to the electronic device, and serpentine flow paths which may require coolant to be pumped therethrough at relatively high pressures, any one or more of which may increase manufacturing costs of the cooling systems and reduced overall cooling performance.

U.S. Pat. No. 7,571,759 discloses a stacked-type cooler with a plurality of parallel cooling tubes and semiconductor devices sandwiched between the cooling tubes so the semiconductor devices are cooled from both sides. The cooling tubes interconnect at one end to an inlet pipe and at the other end to an outlet pipe for parallel flow from the inlet pipe, through the cooling tubes, and to the outlet pipe. However, the design is limited to semiconductor devices arranged in a stacked configuration.

There is a need to provide heat management and removal assemblies for semiconductor devices that generate heat that overcome any one or more of the foregoing drawbacks in addition to being inexpensive to manufacture and operate and easy to install and service.

SUMMARY OF THE DISCLOSURE

In one aspect, this patent document disclosed a heat management and removal assembly for one or more electronic devices. The disclosed assembly may include a manifold body that supports at least one electronic device surface above a chamber. The chamber may accommodate a coolant flow insert. The coolant flow insert may be disposed above a wall that defines a pair of passages that may include an inlet passage and an outlet passage. The inlet and outlet passages may in communication with an inlet manifold and an outlet manifold respectively. The inlet passage may extend towards the outlet manifold the outlet passage may extend towards the inlet manifold. The inlet passage may be in communication with the plurality of inlet ports. Each inlet port may provide communication between the inlet passage and an upper surface of the coolant flow insert. The outlet passage may be in communication with the plurality of outlet ports. Each outlet port may provide communication between the upper surface of the coolant flow insert and the outlet passage.

In another aspect, this document discloses a method for cooling an electronic device surface. The method may include providing communication between an inlet passage and an inlet manifold and between the inlet passage and an upper surface of a coolant flow insert. Further, the method may include providing communication between the outlet passage and the outlet manifold and between the upper surface of the coolant flow insert and the outlet passage. The method may further include flowing coolant through the inlet manifold and to the inlet passage, flowing the coolant through the inlet passage and upwards to the upper surface of the coolant flow insert, flowing coolant across the upper surface of the coolant flow insert and downwards to the outlet passage, and flowing the coolant through the outlet passage and to the outlet manifold.

In yet another aspect, this document discloses another heat management and removal assembly for electronic devices. The disclosed assembly may include a body supporting a plurality of semiconductor devices in a parallel configuration. The body may include an inlet manifold and an outlet manifold. The inlet manifold may be in communication with a plurality of inlet passages. The outlet manifold may be in communication with a plurality of outlet passages. The inlet and outlet manifolds may be parallel to each other and perpendicular to the plurality of inlet and outlet passages. Each electronic device surface may be disposed above a coolant flow insert. Each coolant flow insert may be disposed above one of the inlet passages and one of the outlet passages. Each inlet passage may extend from the inlet manifold towards the outlet manifold. Each outlet passage may extend from the outlet manifold towards the inlet manifold. Each inlet passage may be in communication with a plurality of inlet ports for providing communication between its respected inlet passage and an upper surface of its respective coolant flow insert. Each outlet passage may be in communication with a plurality of outlet ports for providing communication between the upper surface of its respective coolant flow insert and its respective outlet passage.

Other advantages and features will be apparent from the following detailed description when read in conjunction with the attached drawings.

BRIEF DESCRIPTION OF THE DRAWINGS

For a more complete understanding of the disclosed methods and apparatuses, reference should be made to the embodiments illustrated in greater detail on the accompanying drawings, wherein.

Figure 1:
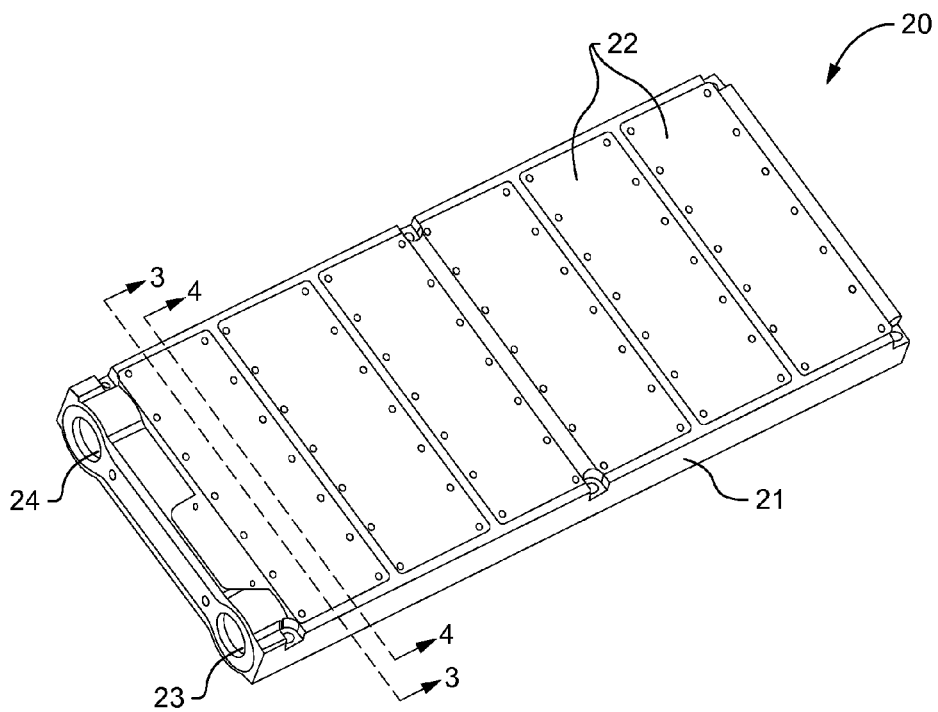
FIG. 1 is a perspective view of one disclosed heat management and removal assembly for semiconductor devices.

It should be understood that the drawings are not necessarily to scale and that the disclosed embodiments are sometimes illustrated diagrammatically and in partial views. In certain instances, details which are not necessary for an understanding of the disclosed methods and apparatuses or which render other details difficult to perceive may have been omitted. It should be understood, of course, that this disclosure is not limited to the particular embodiments illustrated herein.

DETAILED DESCRIPTION OF THE PRESENTLY PREFERRED EMBODIMENTS

FIGS. 1-8 disclose one type of a heat management and removal assembly 20 (hereinafter, "assembly 20") made in accordance with this disclosure. The assembly 20 may include a manifold body 21 that supports one or more electronic device surfaces 22, which can be surfaces 22 of power semiconductor devices, such as IGBTs, or any other electronic devices, which generate heat during use. The assembly 20 manages and removes heat generated from the device surfaces 22. Each device surface 22 may be supported by the manifold body 21 and each device surface 22 may be mounted above an upper opening of one or more chambers 35 (FIG. 2) or bays formed in the manifold body 21. In addition to the one or more chambers 35 shown in FIG. 2, the manifold body 21 includes an inlet manifold channel 23 and an outlet manifold channel 24 that provide communication of fluid to and from the chambers 35 for cooling the device surfaces 22 as explained below. As shown, the manifold body 21 may support a plurality of electronic device surfaces 22 or the manifold body 21 may support a single device surface 22. Further, if the manifold body 21 supports a single device surface 22, the manifold body 21 may be designed to be coupled with other manifold bodies 21 to form a cooling module.

Figure 2:
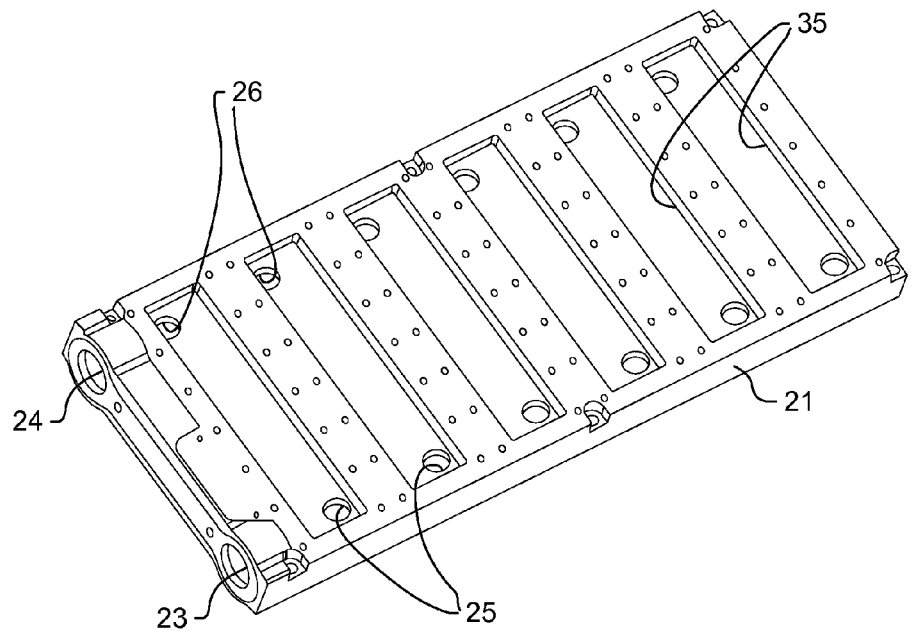
FIG. 2 is another perspective view of the assembly shown in FIG. 1 with the electronic devices and coolant flow inserts or trays removed.
Figure 3:
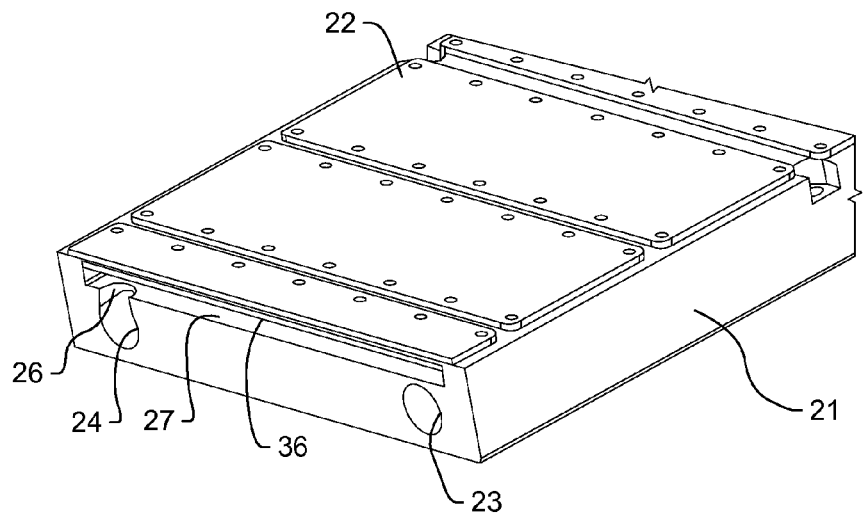
FIG. 3 is a partial perspective and sectional view taken substantially along line 3-3 of FIG. 1.
Figure 4:
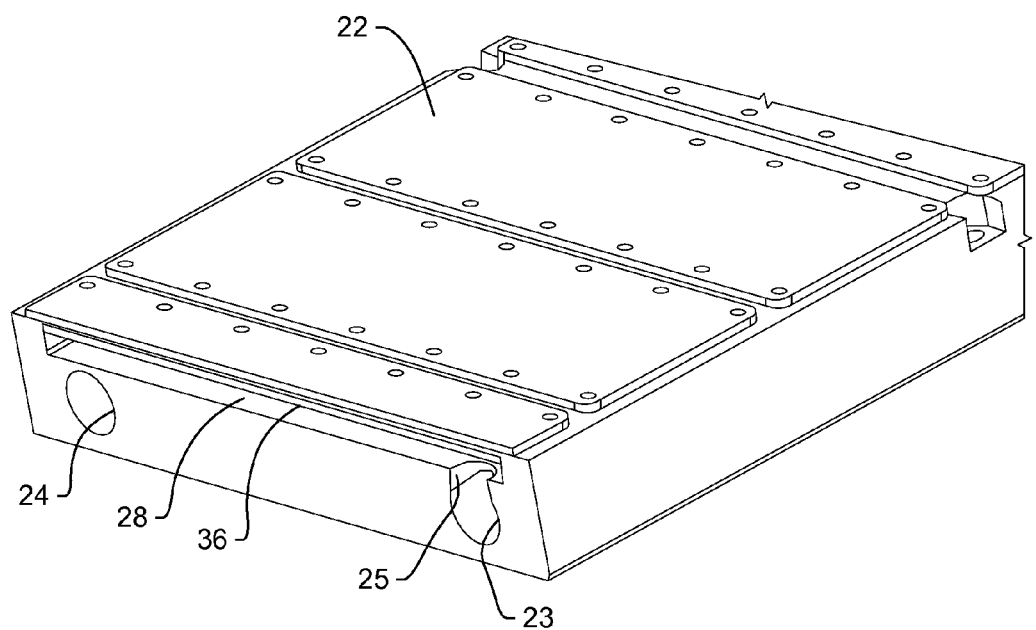
FIG. 4 is a partial perspective and sectional view taken substantially along line 4-4 of FIG. 1.
Figure 5:
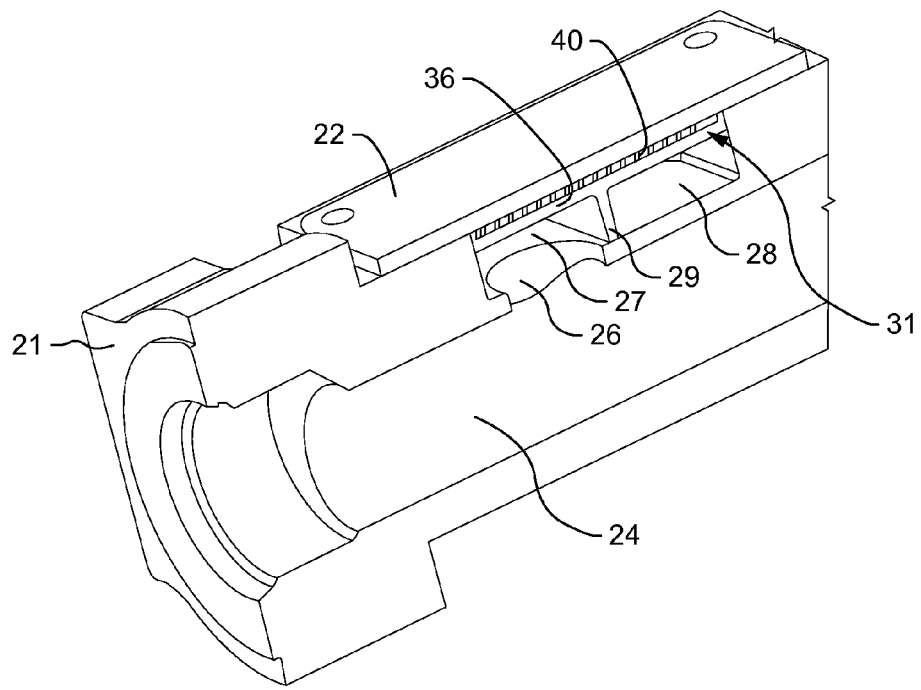
FIG. 5 is a partial perspective and sectional view of the assembly shown in FIGS. 1-4, particularly illustrating the outlet manifold channel, the chamber including the inlet passage and outlet passage, the coolant flow insert, and the outlet opening, which provides communication between the outlet passage and the outlet manifold channel.
Figure 6:
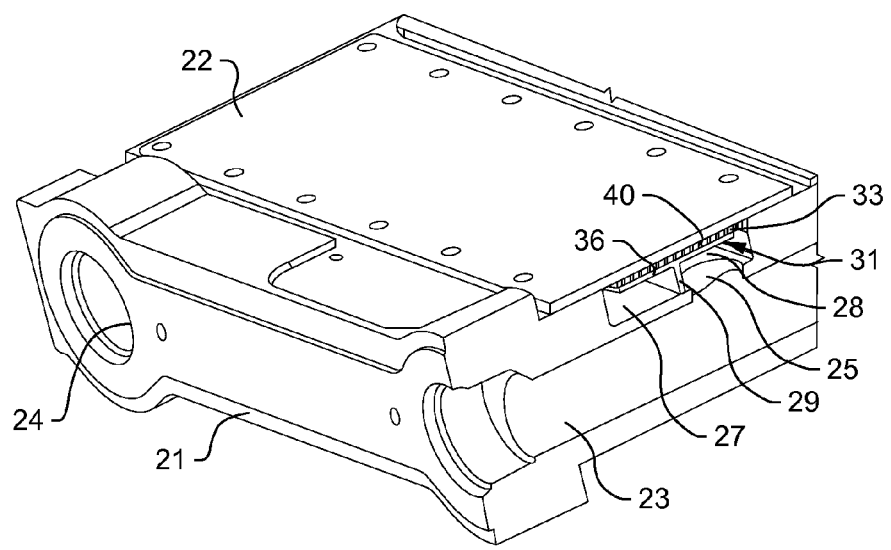
FIG. 6 is a partial perspective and sectional view of the assembly shown in FIGS. 1-5, particularly illustrating the inlet manifold channel, the chamber including the inlet passage and the outlet passage, the coolant flow insert and the inlet opening that provides in communication between the inlet manifold channel and the inlet passage of the chamber.

As shown in FIGS. 2 and 4, the inlet manifold channel 23 may be in communication with one or more inlet openings 25 that provide communication from the inlet manifold channel 23 upward to the chambers 35. As shown in FIGS. 2 and 3, the outlet manifold channel 24 may be in communication with one or more outlet openings 26 that provide communication from the chambers 35 downward to the outlet manifold channel 24. It will be noted that the inlet manifold channel 23 and outlet manifold channel 24 may be spaced laterally from the chambers 35, above the chambers 35 or below the chambers 35 as shown in FIGS. 1-4. In addition, as shown in FIGS. 5-6, each chamber 35 may be divided into an outlet passage 27 (see also FIG. 3) and an inlet passage 28 (see also FIG. 3) by an elongated wall 29 of a coolant flow insert 31. The inlet openings 25 (FIGS. 2, 4 and 6) for each chamber 35 or, more specifically, for each inlet passage 28 may be formed in bottom surfaces of the inlet passages 28 or in the manifold body 21. Each inlet opening 25 extends between and fluidly connects the inlet manifold channel 23 with its respective inlet passage 28. Similarly, the outlet openings 26 (FIGS. 2-3 and 5) for each chamber 35 or for each outlet passage 27 are formed in bottom surfaces of the outlet passages 27 or in the manifold body 21. Thus, as shown in FIG. 3, each outlet opening 26 extends between and fluidly connects its respective outlet passage 27 of its respective chamber 35 with the outlet manifold channel 24. Further, as seen in FIG. 2, the inlet openings 25 and the outlet openings 26 may be disposed at opposite ends of the chambers 35.

Each chamber 35 may be sized and configured to receive a coolant flow insert 31 (FIGS. 5-8), or a turbulator, between the bottom surface of the chamber 35 and the electronic device surface 22. Each coolant flow insert 31 may include an upper tray 36 connected to an elongated wall 29 that separates the chamber 35 into the inlet passage 28 and the outlet passage 27. Alternatively, the wall 29 may be formed as a separate component or the wall 29 may be integral to the manifold body 21 (see, e.g., FIG. 14) or the wall 29 may be part of a lower tray that lines the bottom surface of the chamber 35 (see, e.g., FIG. 12).

Figure 19:
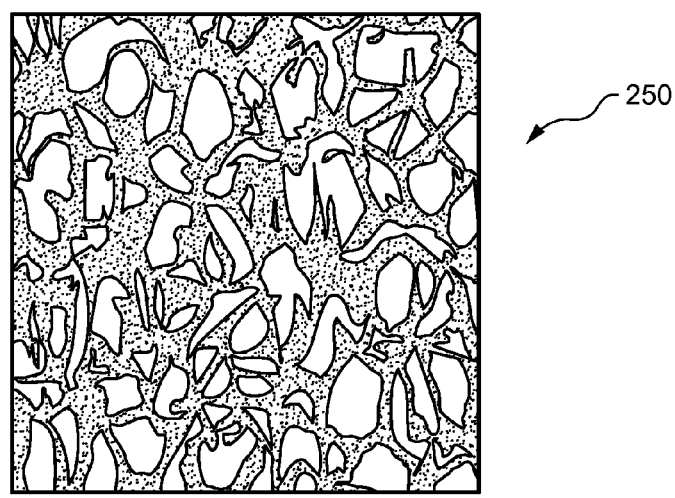
FIG. 19 is an exemplary partial plan view of an open cell matrix body that may be used with the disclosed heat management and removal assemblies in lieu of projecting fins or other members.

Each coolant flow insert 31 receives coolant from its respective the inlet passage 28. Specifically, coolant flows from one of the inlet openings 25, into the inlet passage 28, and upward through the inlet ports 33 in the tray 36 to the finned upper surface 40 of the tray 36 (FIG. 7), which is disposed beneath the electronic device surface 22. Each coolant flow insert 31 may then direct the coolant across the upper surface 40, through the array of coolant mixing fins 56 before proceeding downwards from the upper surface 40 and through the outlet ports 34 to the outlet passage 27. The upper surface 40 may include a network of fins or coolant mixing fins 56, which can be configured to channel, distribute, mix, and circulate the coolant along and throughout the undersurface area of the electronic device surface 22 as the coolant flows from the inlet ports 33, across the surface 40 to the outlet ports 34. The coolant mixing fins 56 may serve as fins or baffles that create mixing flow across the upper surface 40 of the coolant flow insert 31. To provide uniform flow across the upper surface 40, the plurality of inlet ports 33 and the plurality of outlet ports 34 may be spaced apart and extend along the tray 36 of the coolant flow insert 31 and therefore along the lengths of the inlet and outlet passages 28, 27 respectively. Instead of a tray 36 with a plurality of fins 56, the tray may include or support an open cell matrix, such as the open cell matrix 250 shown in FIG. 19. The open cell matrix 250 may be a foam, such as a metal foam, or other known open cell structures for providing a tortuous path for the coolant to flow through as the coolant proceeds from the inlet ports 33 to the outlet ports 34.

Referring the FIGS. 5-6, fluid flows into the inlet manifold channel 23 before fluid flows through the inlet opening 25 and into the inlet passage 28. Fluid flows generally along the inlet passage 28 and is isolated from the outlet passage 27 by the elongated wall 29. However, fluid migrates from the inlet passage 28 to the outlet passage 27 by flowing upwards through the plurality of inlet ports 33 in the tray 36 that are spaced apart above the inlet passage 28. The inlet ports 33 provide communication between the inlet passage 28 and the upper surface 40 of the tray 36 of the coolant flow insert 31, which may include a plurality of coolant mixing fins 56 that act to impart a mixing flow to the coolant. Fluid flows across the upper surface 40 towards the plurality of outlet ports 34 that are disposed above and spaced apart along the outlet passage 27. Thus, the outlet ports 34 provide communication between the upper surface 40 of the coolant flow insert 31 and the outlet passage 27. Fluid flows through the outlet ports 34 to the outlet passage 27 and along the outlet passage 27 towards the outlet opening 26 that is in communication with the outlet manifold channel 24 as shown in FIGS. 2-3 and 5. Each inlet passage 28, each outlet passage 27 and each coolant flow insert 31 may be disposed below one of the electronic device surfaces 22 for purposes of cooling the electronic device surface 22.

Figure 7:
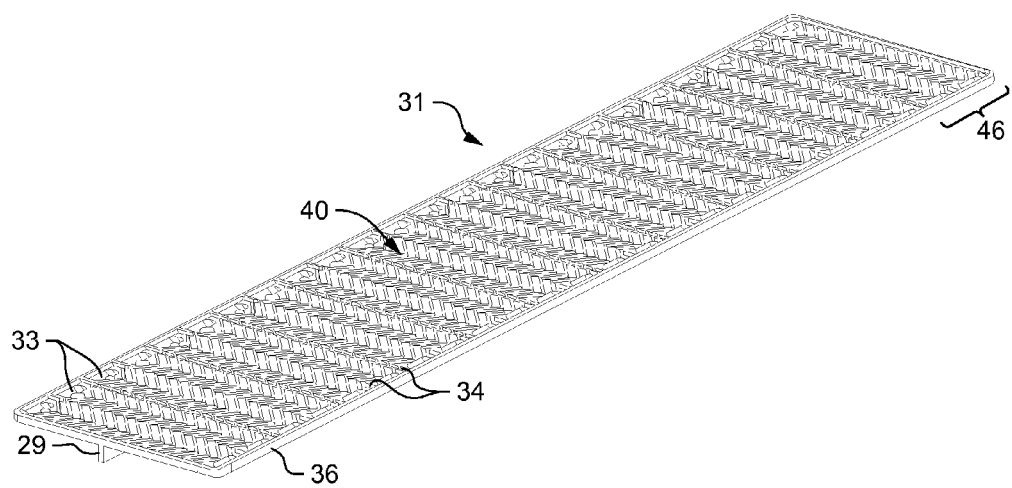
FIG. 7 is a perspective view of a coolant flow insert for use with the assembly shown in FIGS. 1-6.

As shown in FIG. 7, each coolant flow insert 31 may have a T-shaped configuration with an upper tray 36 and a downwardly extending elongated wall 29. Each coolant flow insert 31 may be arranged in one of the chambers 35 (FIG. 2) of the manifold body 21 with the upper tray 36 of the coolant flow insert 31 near the open upper end of the chamber 35 and with the wall 29 extending downward to define the inlet passage 28 and outlet passage 27 as discussed above. To this end, the wall 29 of the coolant flow insert 31 may be configured to extend the longitudinal length of the chamber 35 and downward to the bottom of the chamber 35 as shown in FIGS. 5-6.

Figure 8:
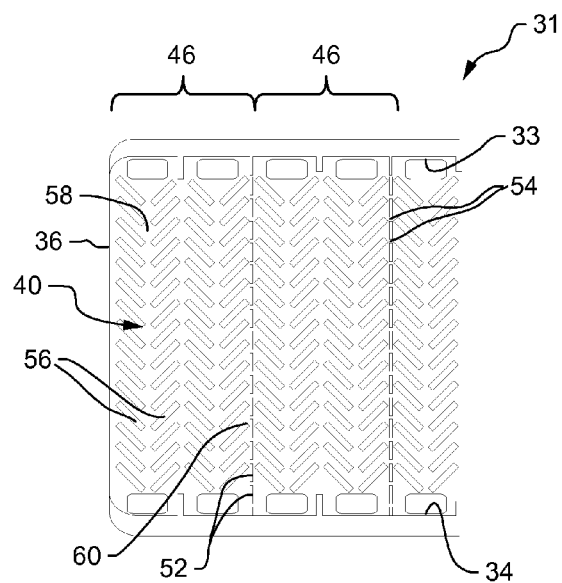
FIG. 8 is a partial and enlarged plan view of the coolant flow insert shown in FIG. 7, particularly illustrating the placement of projections or fins.

Referring to FIG. 8, for directing the flow of coolant adjacent to the underside of the electronic device surface 22, the finned upper surface 40 of the tray 36 of the coolant flow insert 31 may be divided into a plurality of individual cells 46 arranged in parallel. Dividing walls 52 may separate the adjacent cells 46 from each other. The parallel arrangement of the cells 46 reduces the pressure drop of the coolant between the inlet passage 28 and the outlet passage 27 as compared to cells arranged in series. As best shown in FIG. 8, each cell 46 may include a pair of inlet ports 33 in the tray 36 at one longitudinal side thereof that communicates with the inlet passage 28. Each cell 46 may further include a pair of outlet ports 34 in the tray 36 at the opposing longitudinal side thereof that communicates with the outlet passage 27. In operation, coolant may be drawn or directed into each cell 46 on the surface 40 of the tray 36 from the inlet passage 28 through one of the respective inlet ports 33. The coolant may then flow over the surface 40 of the tray 36 through each cell 46 in a downstream direction from the inlet ports 33 to the outlet ports 34. The coolant may then be drawn out of or directed off the cell 46 through the respective outlet port 34 and into the outlet passage 27 where it can exit the chamber 35 to the outlet manifold channel 24 through the outlet opening 26.

As noted above, dividing walls 52 can separate adjacent cells 46 from one another. In order to help balance the pressure between adjacent cells 46, each dividing wall 52 may have a plurality of openings 54 therein as best shown in FIG. 8. With such an arrangement, the cells 46 are discrete from one another but they are also fluidly connected. Fluidly connecting the individual cells 46 with each other helps ensure an even pressure distribution across the plurality of cells 46. The even pressure distribution, in turn, leads to equalized coolant flow rates through the individual cells 46 which helps prevent hot spots in the device surface 22. To further enhance cooling performance, dividing walls may not be provided at either longitudinal end of the tray 36 leaving the corresponding first and last cells 46 on the tray 36 substantially open on one edge as shown in FIG. 7. This arrangement can effectively increase the heat transfer area provided on the upper surface 40 of the tray 36 because it exposes more of the electronic device surface 22 to the coolant, which may have a significantly higher heat transfer than that of the material used to construct the dividing walls 52.

To facilitate the generation of vortices in the flow of coolant through the cells 46, each cell 46 can include a plurality of coolant mixing fins 56 that are arranged in a herringbone pattern on the upper surface 40 of the tray 36. More specifically, as shown in FIG. 8, each cell 46 may include a plurality of fins 56 arranged in four rows that extend in the downstream direction (i.e., the direction starting at the inlet port 33 of the cell 46 and extending towards the outlet port 34 of the cell 46). Each fin 56 in each row angles in the downstream direction. In the embodiment of FIGS. 7-8, each fin 56 in the each row is paired with an opposing fin 56 in an adjacent row that together form a V-shape. As shown in FIG. 8, the V-shape formed by the opposing fins 56 is broken by a flow opening 58 between the opposing fins 56. As shown in FIG. 8, the fins 56 in one row are relatively longer than the fins 56 in the adjacent row. The herringbone arrangement of the fins 56 produces vortices in the flow through the cells 46, which mixes the coolant and leads to better to coolant performance. Moreover, the herringbone pattern of the fins 56 can reduce the flow resistance of the coolant flow insert 31, which can help reduce the pressure drop between the inlet manifold channel 23 and the outlet manifold channel 24 of the manifold body 21. Herringbone patterns other than that shown in FIGS. 7-8 may also be used, such as arrangements with more or less than four rows of fins 56 in each cell and/or arrangements that alternate between which fin 56 is longer in each opposing pair.

To provide further enhancement of the vortex mixing, the fins 56 may be arranged and configured such that the fins 56 do not intersect with the dividing walls 52 between the cells 46. More particularly, as shown in FIG. 8, the fins 56 next to a dividing wall 52 may be spaced from the dividing wall 52 such that an opening 60 is provided between the end of the fin 56 nearest the dividing wall 52 and the dividing wall 52. The openings 60 can help prevent recirculation of the flow of coolant in the individual cells 46. For example, if openings 60 are not provided, the channels defined between adjacent fins 56 in the direction of flow would dead end at the dividing wall 52. Such dead ends could hamper downstream flow and cause the coolant to re-circulate through the cell 46 in the upstream direction, potentially leading to localized high coolant temperatures and pressures. The openings 60 between the ends of the fins 56 and the dividing walls 52 can create further vortex mixing of the coolant that can help prevent the flow of coolant from becoming stagnant.

Figure 9:
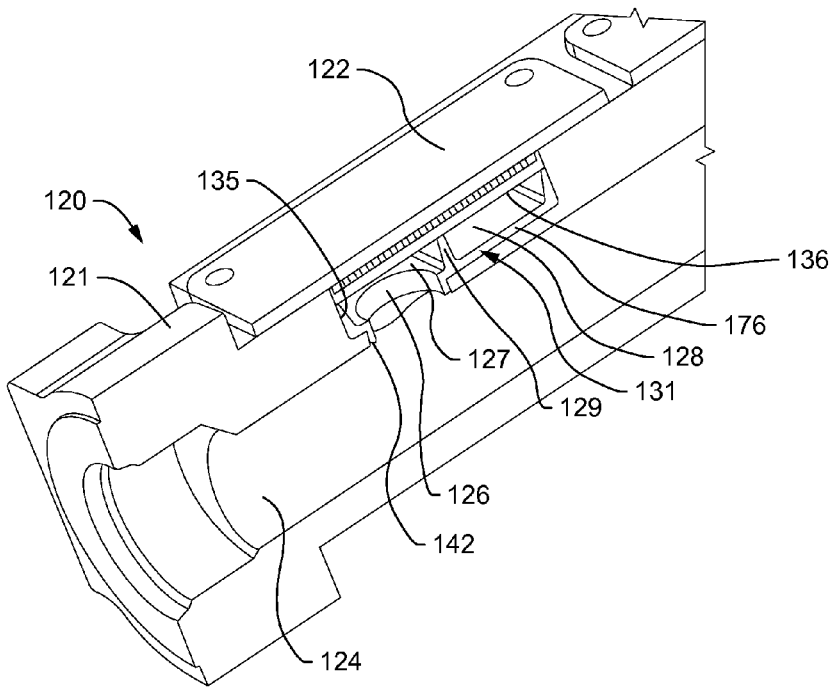
FIG. 9 is a partial perspective and sectional view of a second heat removal and management assembly featuring an alternative coolant flow insert that includes an upper tray shown in FIG. 11 and a lower tray shown in FIG. 12.
Figure 10:
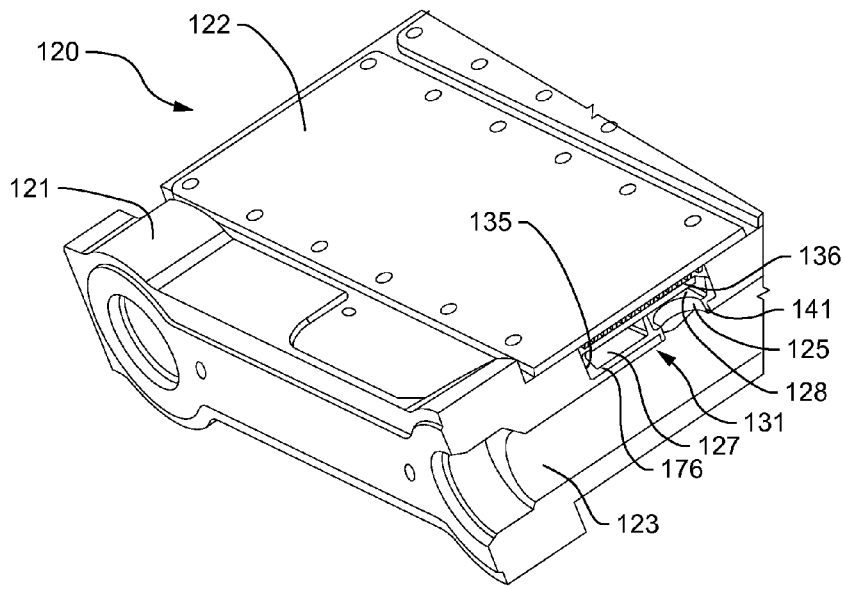
FIG. 10 is another partial perspective and sectional view of the assembly shown in FIG. 9.
Figure 11:
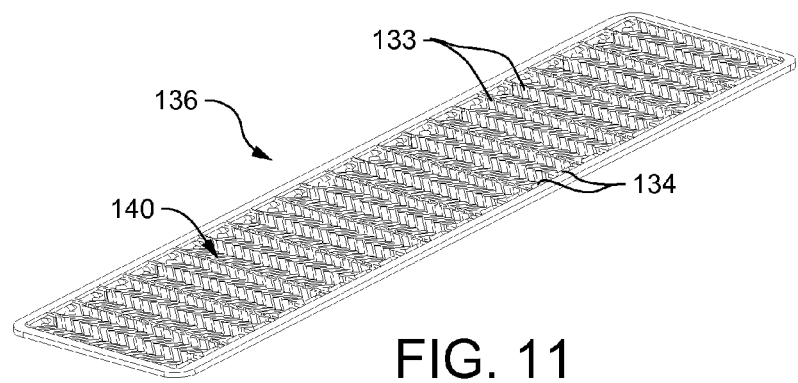
FIG. 11 is a perspective view of the upper tray of the assembly shown in FIGS. 9-10.
Figure 12:
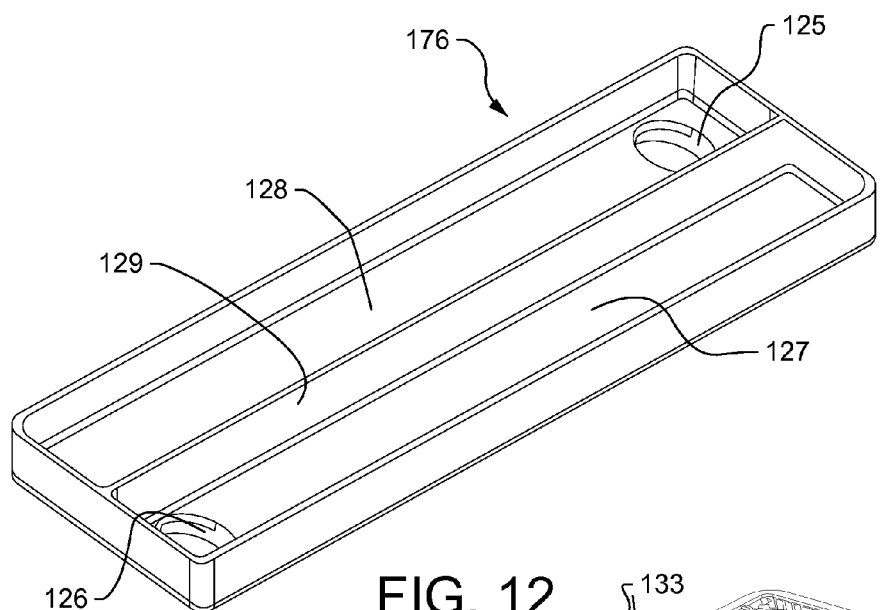
FIG. 12 is a perspective view of the lower tray of the assembly shown in FIGS. 9-10.
Figure 13:
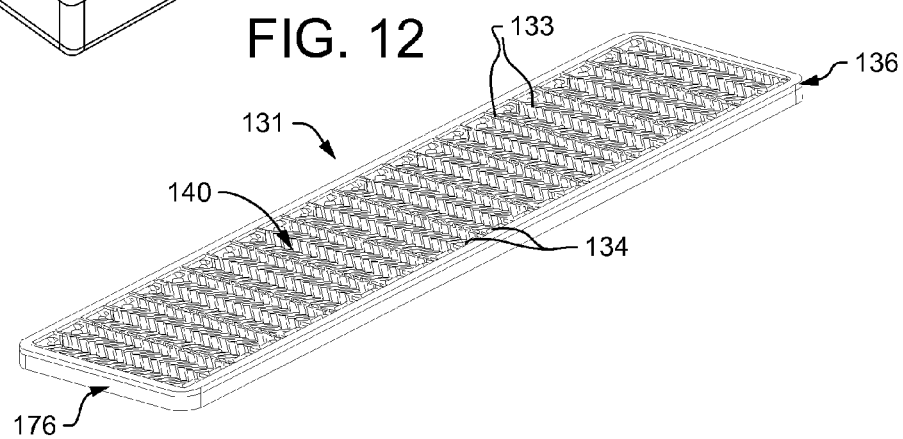
FIG. 13 is a perspective view of the coolant flow insert for use in the assembly of FIGS. 9-10, particularly illustrating the upper tray of FIG. 11 and the lower tray of FIG. 12, which may be welded or bonded together.

FIGS. 9-13 illustrate another heat management and removal assembly 120 for one or more electronic device surfaces 122. A perspective view of the assembly 120 resembles the perspective view of the assembly 20 shown in FIG. 1. The assembly 120 may include a coolant flow insert 131 (FIG. 13) that includes an upper tray 136 (FIG. 11) disposed above and connected to a lower tray 176 (FIG. 12). As shown in FIGS. 9-10 and 12, the lower tray 176 may form an inlet opening 125 (FIGS. 10, 12) and an outlet opening 126 (FIGS. 9, 12) with the manifold body 121 of the assembly 120. One way to make a seal between the lower tray 176 and the body 121 is to provide a downwardly extending lip 141 (FIG. 10) that matingly extends into an opening formed in the body 121. Further, referring to FIG. 9, the lower tray 176 may also include a downwardly extending lip 142 that matingly extends into an opening formed in the body 121. The disclosed lower tray 176 prevents, or, at the very least, minimizes leakage of coolant as it flows from the inlet manifold channel 123, though the inlet opening 125 and to the inlet passage 128, and from the outlet passage 127, through the outlet opening 126 to the outlet manifold channel 124. The prevention of leakage results in improved cooling performance. Further, the wall 129 prevents leakage from the inlet passage 128 directly to the outlet passage 127 and forces the coolant to flow upward from the inlet passage 128, through the inlet ports 133, across the finned upper surface 140 (or open cell matrix) before flowing through the outlet ports 134 and down into the outlet passage 127. The coolant flow insert 131 may include the upper tray 136 disposed above and connected to the lower tray 176 as two separate pieces which may be removably, or alternatively, non-removably, connected. The upper tray 136 and lower tray 176 may be welded or bonded together to minimize the coolant leakage between inlet passage 128 and outlet passage 127. In yet another embodiment, the coolant flow insert 131, including the upper tray 136 and the lower tray 176 thereof, can be formed as a single unitary body. The coolant flow insert 131 may be snap-fitted into the chamber 135 that is formed in the manifold body 121 of the assembly 120.

Figure 14:
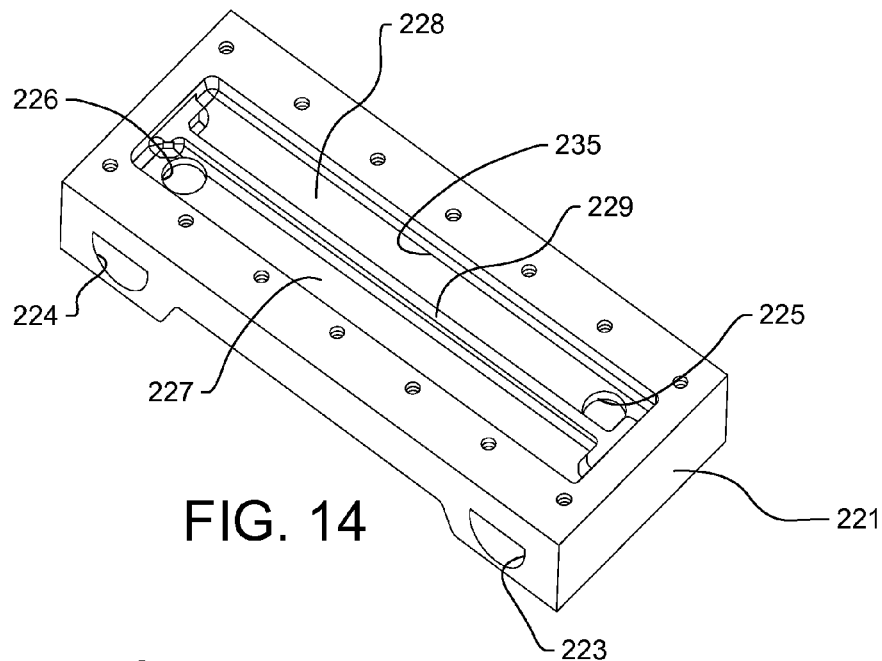
FIG. 14 is a perspective view of a manifold body of a third heat management and removal assembly made in accordance with this disclosure and shown in FIG. 18.

FIGS. 14-18 illustrate yet another heat management and removal assembly 220 (FIG. 18) for an electronic device surface. In the embodiment shown in FIG. 18, the assembly 220 supports a single device surface 222 above its manifold body 221, but a plurality of manifold bodies 221 may be connected together to create a parallel cooling circuit as described above in connection with the assemblies 20, 120 of FIGS. 1-8 and 9-13 respectively. Referring to FIG. 14, the manifold body 221 may include a chamber 235 with an elongated wall 229 that may separate the chamber 235 into an inlet passage 228 and an outlet passage 227. The manifold body 221 may also define an inlet manifold channel 223 and an outlet manifold channel 224. The inlet manifold channel 223 may be in communication with the inlet passage 228 by way of the inlet opening 225. The outlet passage 227 may be in communication with the outlet manifold channel 224 by way of the outlet opening 226.

Figure 15:
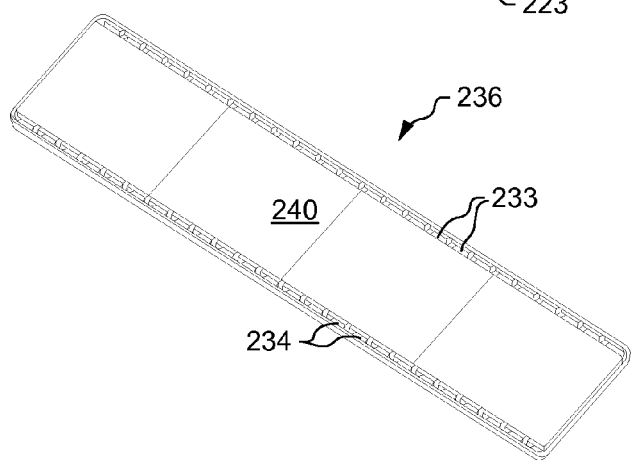
FIG. 15 is a perspective view of a tray of a coolant flow insert for use in the assembly of FIG. 18.
Figure 16:
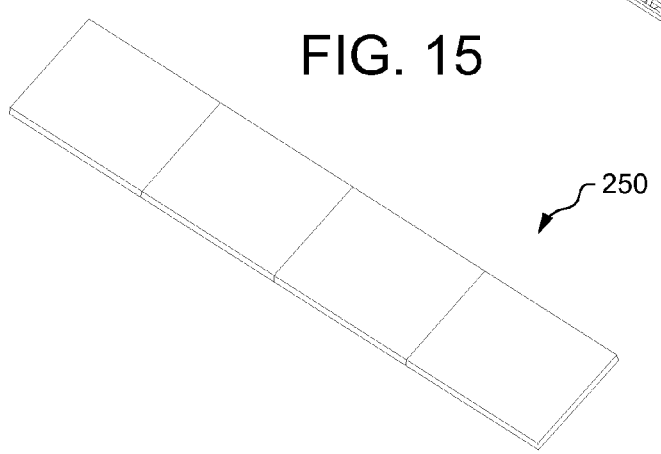
FIG. 16 is a perspective view of an open cell matrix body for use with the tray of FIG. 15 in the assembly of FIG. 18.
Figure 17:
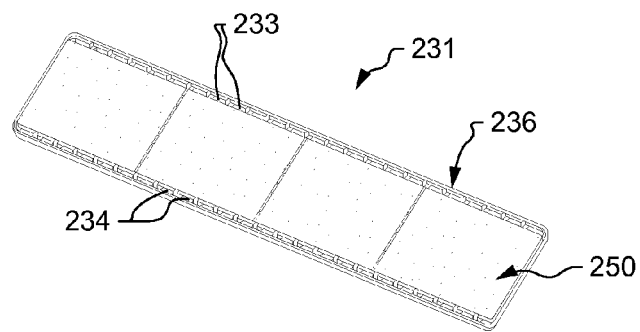
FIG. 17 is a perspective and schematic view the body of FIG. 16 disposed on the tray of FIG. 15 to form a coolant flow insert for use with the manifold body of FIG. 14.

The manifold body 221 may accommodate a tray 236 as shown in FIG. 15. The tray 236 may include a plurality of inlet ports 233 and a plurality of outlet ports 234. The inlet ports 233 may provide communication between the inlet passage 228 and the upper surface 240 of the tray 236. The outlet ports 234 may provide communication between the upper surface 240 of the tray 236 and the outlet passage 227. The tray 236, instead of fins, may accommodate an open cell matrix 250 as shown in FIGS. 16 and 17, as well as the enlarged view of an examplary open cell matrix 250 shown in FIG. 19. The open cell matrix 250 may be embodied as an insert and received within the tray 236. In other embodiments, the open cell matrix 250 may be attached to or, alternatively, formed as an extension of the upper surface 240 of the tray 236. The open cell matrix 250 can include a flow-through, open, internal surface area which can include a network of interconnected pores or cells configured to distribute and direct the coolant through a tortuous, non-linear path as the coolant is engaged by and directed through the open cell matrix 250. In particular, in one embodiment, the open cell matrix 250 can include a random or irregular, or alternatively, a non-random, regular, or patterned three-dimensional structural matrix which can form a corresponding random or irregular, or alternatively, a non-random, regular, or patterned, respectively, three-dimensional array or network of interconnected pores or cells throughout the open cell matrix 250. The open cell matrix 250 may be fabricated from any material that can provide an open cell structural matrix consistent with any one of the embodiments disclosed herein. In one embodiment, the open cell matrix 250 can be a foam, such as, for example, a metallic foam. The open cell matrix 250, including the three-dimensional structural matrix thereof, can be fabricated out of any suitable metal, plastic, or other composite material, which, in one embodiment, can be formed by a metallic, plastic, or composite material additive manufacturing or three-dimensional printing process.

Figure 18:
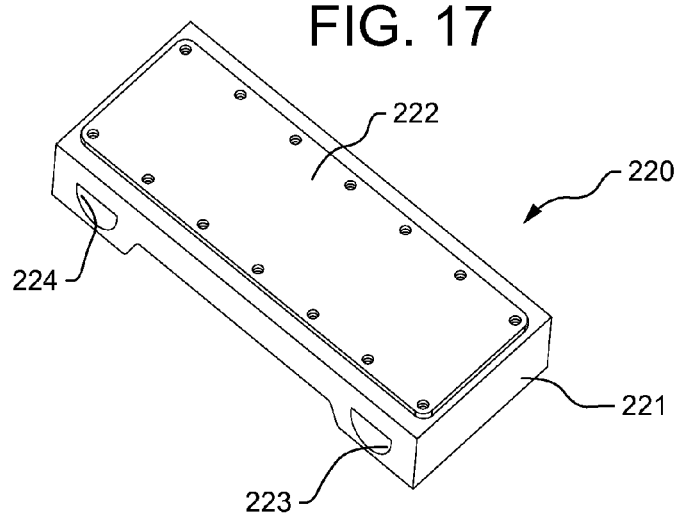
FIG. 18 is a perspective view of a heat management and removal assembly that includes the manifold body of FIG. 14 and the coolant flow insert of FIG. 17.

The open cell matrix 250 may be placed on top of the tray 236 (FIG. 17) to form a coolant flow insert 231 that may be accommodated in the chamber 235 as illustrated in FIG. 18. Thus, fluid flows into the inlet manifold channel 223 before flowing upward through the inlet opening 225 and before flowing into the inlet passage 228 (FIG. 14). Fluid then migrates from the inlet passage 228 upward through the inlet ports 233 and across or through a tortuous path of interconnected pores or cells created by the open cell matrix 250 before proceeding downward through the outlet ports 234 to the outlet passage 227. Fluid then flows from the outlet passage 227 through the outlet opening 226 and out through the outlet manifold channel 224.

INDUSTRIAL APPLICABILITY

The disclosed assemblies 20, 120, 220 are useful for cooling electronic devices, such as power semiconductor devices which include, but are not limited to IGBTs. IGBTs are utilized in a wide scope of applications including but not limited to industrial machinery. The disclosed assemblies 20, 120, 220 are capable of cooling one or more IGBTs at a time in an efficient manner by providing a parallel cooling circuit. Specifically, the disclosed assemblies 20, 120 220 employ a parallel circuit that requires less pump power to flow coolant through the assemblies 20, 120, 220. Each assembly 20, 120, 220 may include an inlet manifold channel 23, 123, 223 and an outlet manifold channel 24, 124, 224 disposed below one or more coolant flow inserts 31, 131, 231 that are disposed transversely to the inlet and outlet manifold channels 23, 123, 223, 24, 124, 224. Coolant flows from its respective inlet manifold channel 23, 123, 223, through an inlet opening 25, 125, 225, transversely at least partially along one inlet passage 28, 128, 228 before migrating through one or more inlet ports 33, 133, 233, before flowing across through a tortuous path created by the coolant flow insert 31, 131, 231 before exiting the coolant flow insert 31, 131, 231 through an outlet port 34, 134, 234 before proceeding along an outlet passage 27, 127, 227 and through an outlet opening 26, 126, 226 before exiting through an outlet manifold channel 24, 124, 224. The above-described flow path is less serpentine-like than the series-type coolant circuits currently employed in cooling assemblies for heat generating electronic devices. In addition to providing a parallel-type cooling circuit, the disclosed tray 136 of the assembly 120 provides improved sealing between the tray 136 and the manifold body 121. The coolant flow insert 31, the tray 136, and the manifold body 221 effectively isolate the inlet passages 28, 128, 228 from the outlet passages 27, 127, 227. The prevention of leakage and improved isolation of the inlet passages 28, 128, 228 from the outlet passages 27, 127, 227 further reduces the pump power requirements and increases the efficiency of the assemblies 20, 120, 220.

While only certain embodiments have been set forth, alternatives and modifications will be apparent from the above description to those skilled in the art. These and other alternatives are considered equivalents and within the spirit and scope of this disclosure and the appended claims.

What is claimed:

1. A heat management and removal assembly for an electronic device surface, the assembly comprising:
    a manifold body at least partly defining an inlet manifold, an outlet manifold, and a chamber, the manifold body supporting the electronic device surface facing the chamber;
    a coolant flow insert disposed within the chamber between the electronic device surface and the manifold body; and
    an elongated wall disposed within the chamber between the coolant flow insert and the manifold body, the elongated wall at least partly defining an inlet passage and an outlet passage within the chamber,
    the inlet manifold being in fluid communication with the outlet passage via the inlet passage, and
    the inlet passage being in fluid communication with the outlet manifold via the outlet passage,
    the inlet passage extending toward the outlet manifold, the outlet passage extending toward the inlet manifold,
    the inlet passage being in fluid communication with an upper surface of the coolant flow insert via a plurality of inlet ports,
    the upper surface of the coolant flow insert being in fluid communication with the outlet passage via a plurality of outlet ports,
    wherein the upper surface of the coolant flow insert includes a plurality of fins extending toward the electronic device surface.

2. The assembly of claim 1 wherein the inlet and outlet manifolds are parallel to each other and perpendicular to the inlet and outlet passages.

3. The assembly of claim 1 wherein the upper surface of the coolant flow insert includes an open cell matrix disposed between the plurality of outlet ports and the plurality of inlet ports.

4. The assembly of claim 3 wherein the open cell matrix is a foam.

5. The assembly of claim 3 wherein the coolant flow insert includes a tray that supports the open cell matrix and that defines the plurality of inlet ports and the plurality of outlet ports.

6. The assembly of claim 1 wherein the inlet passage is parallel to the outlet passage.

7. The assembly of claim 6 wherein the inlet and outlet manifolds are parallel to each other and perpendicular to the inlet and outlet passages.

8. The assembly of claim 1 wherein the inlet and outlet passages are separated by the elongated wall.

9. The assembly of claim 1, further comprising a lower tray disposed within the chamber between the coolant flow insert and the manifold body, the lower tray including the elongated wall,
    wherein the lower tray at least partly defines
        the inlet passage and the outlet passage,
        an inlet opening providing fluid communication between the inlet passage and the inlet manifold, and
        an outlet opening providing fluid communication between the outlet passage and the outlet manifold.

10. The assembly of claim 9 wherein the coolant flow insert includes an upper tray that defines the plurality of outlet ports and the plurality of inlet ports, the upper tray being disposed between the lower tray and the electronic device surface, the lower tray including an outer periphery that forms a seal with an underside of the upper tray, the elongated wall also forming a seal with an underside of the upper tray.

11. The assembly of claim 10 wherein the upper tray includes the plurality of fins.

12. A method for cooling an electronic device surface, the method comprising:
    supporting a coolant flow insert facing an inlet passage and an outlet passage; providing fluid communication between the inlet passage and an inlet manifold and between the outlet passage and an outlet manifold;
    providing fluid communication between the inlet passage and an upper surface of the coolant flow insert;
    providing fluid communication between the upper surface of the coolant flow insert and the outlet passage;
    flowing coolant to the inlet passage via the inlet manifold;
    flowing the coolant from the inlet passage to the upper surface of the coolant flow insert via a plurality of inlet ports, a flow direction through the plurality of inlet ports being perpendicular to a flow direction through the inlet passage;
    flowing the coolant across the upper surface of the coolant flow insert to the outlet passage via a plurality of outlet ports, a flow direction through the plurality of outlet ports being perpendicular to a flow direction through the outlet passage; and
    flowing the coolant through the outlet passage and to the outlet manifold,
    wherein flowing the coolant across the upper surface of the coolant flow insert includes flowing the coolant across a plurality of fins extending from the coolant flow insert toward the electronic device surface.

13. The method of claim 12 wherein the inlet and outlet passages are parallel to each other, and a flow direction of coolant across the upper surface of the coolant flow insert is transverse to the inlet and outlet passages.

14. The method of claim 13 wherein the inlet and outlet passages are perpendicular to the inlet and outlet manifolds.

15. The method of claim 12 wherein the coolant flow insert includes an open cell matrix supported on a tray above the inlet and outlet passages, the tray including a plurality of inlet ports providing fluid communication between the inlet passage and the open cell matrix and a plurality of outlet ports providing fluid communication between the open cell matrix and the outlet passage.

16. The method of claim 12 wherein the coolant flow insert includes a foam body, and
   the method further comprises fabricating the foam body using additive manufacturing.

17. A heat management and removal assembly for electronic devices, the assembly comprising:
   a body at least partly defining an inlet manifold, an outlet manifold, a plurality of inlet passages, and a plurality of outlet passages, the body supporting a plurality of electronic device surfaces in a parallel configuration, the inlet manifold being in fluid communication with the plurality of inlet passages, the outlet manifold being in fluid communication with the plurality of outlet passages, the inlet and outlet manifolds being arranged parallel to each other and perpendicular to the plurality of inlet passages and the plurality of outlet passages and
   a plurality of coolant flow inserts, each coolant flow insert of the plurality of coolant flow inserts being disposed between a respective electronic device surface of the plurality of electronic device surfaces and a respective inlet passage of the plurality of inlet passages and a respective outlet passage of the plurality of outlet passages,
   each inlet passage of the plurality of inlet passages extending from the inlet manifold toward the outlet manifold, each outlet passage of the plurality of outlet passages extending from the outlet manifold toward the inlet manifold,
   each inlet passage of the plurality of inlet passages being in fluid communication with an upper surface of a respective coolant flow insert of the plurality of coolant flow inserts via a plurality of inlet ports, each outlet passage of the plurality of outlet passages being in fluid communication with the upper surface of the respective coolant flow insert via a plurality of outlet ports,
   wherein the upper surface of each coolant flow insert of the plurality of coolant flow inserts includes a plurality of fins extending toward the respective electronic device surface.

18. The assembly of claim 17 wherein each coolant flow insert includes
   an elongated wall that at least partly defines the respective inlet passage and the respective outlet passage, and
   a lower tray defining
      an inlet opening providing fluid communication between the respective inlet passage and the inlet manifold, and
      an outlet opening providing fluid communication between the respective outlet passage and the outlet manifold.

19. The assembly of claim 17 wherein each coolant flow insert includes an open cell matrix.

20. The assembly of claim 1, wherein the plurality of fins form a herringbone pattern on the upper surface of the coolant flow insert.

* * * * *